United States Patent
Dong et al.

(10) Patent No.: US 12,305,339 B1
(45) Date of Patent: May 20, 2025

(54) METHOD AND SYSTEM FOR CONTROLLING VENTILATION COOLING TYPE PERMAFROST SUBGRADE BASED ON ENERGY DYNAMIC BALANCE

(71) Applicant: CCCC FIRST HIGHWAY CONSULTANTS CO., LTD., Shaanxi Province (CN)

(72) Inventors: Yuanhong Dong, Shaanxi Province (CN); Long Jin, Shaanxi Province (CN); Jianbing Chen, Shaanxi Province (CN); Liguo Zhao, Shaanxi Province (CN); Huilong Zhao, Shaanxi Province (CN); Hui Peng, Shaanxi Province (CN); Kun Yuan, Shaanxi Province (CN); Nanlu Zhao, Shaanxi Province (CN); Ruoyu Hao, Shaanxi Province (CN); Qirang Yang, Shaanxi Province (CN); Jiamin Zhao, Shaanxi Province (CN)

(73) Assignee: CCCC FIRST HIGHWAY CONSULTANTS CO., LTD., Shaanxi Province (CN)

( * ) Notice: Subject to any disclaimer, the term of this patent is extended or adjusted under 35 U.S.C. 154(b) by 0 days.

(21) Appl. No.: 18/988,684

(22) Filed: Dec. 19, 2024

(30) Foreign Application Priority Data

Jan. 22, 2024   (CN) .......................... 202410088616.2

(51) Int. Cl.
  *E01C 11/24*   (2006.01)
  *E01C 3/06*   (2006.01)
  (Continued)

(52) U.S. Cl.
  CPC ................ *E01C 11/24* (2013.01); *E01C 3/06* (2013.01); *E02D 27/35* (2013.01); *G06F 30/20* (2020.01)

(58) Field of Classification Search
  CPC . E01C 11/24; E01C 3/06; G06F 30/20; E02D 27/35
  See application file for complete search history.

(56) References Cited

U.S. PATENT DOCUMENTS 12,085,212 B1 * 9/2024 Cao .......................... F17D 1/084
2020/0064028 A1   2/2020 Warren et al.

FOREIGN PATENT DOCUMENTS

CN    106120506 A    11/2019
JP    2009121174 A    11/2009

OTHER PUBLICATIONS

Yuan, Kun et al., "Design method of air-cooled embankment based on permafrost cooling power demand", Journal of Chang'an University (Natural Science Edition), vol. 35, No. 5, Sep. 30, 2015, pp. 35-42.

(Continued)

*Primary Examiner* — Chad G Erdman
(74) *Attorney, Agent, or Firm* — CKC & Partners Co., LLC

(57) ABSTRACT

The invention provides a method and system for controlling ventilation cooling type permafrost subgrade based on energy dynamic balance, wherein the method comprises the steps of constructing a heat absorption predicting model; and inputting an operating condition combination of a permafrost subgrade into the heat absorption predicting model to produce a predicted heat absorption for the permafrost subgrade, and controlling a cooling system to operate based on the predicted heat absorption. The heat absorption predicting model is constructed based on a seed point algorithm of formula matrix, which comprises the steps of producing (Continued)

a known fitting formula; establishing a formula matrix; and calculating a predictive fitting formula corresponding to a new seed point by known seed points in the formula matrix and an index formula, and then calculating the predicted heat absorption based on the predictive fitting formula.

8 Claims, 1 Drawing Sheet

(51) Int. Cl.
   *E02D 27/35* (2006.01)
   *G06F 30/20* (2020.01)

(56) References Cited

OTHER PUBLICATIONS

Wang, Guangdi et al., "Prediction of Thaw Settlement Deformation of Permafrost Subgrade Based on Nonlinear Chaos Theory", West-China Exploration Engineering, vol. 9, No. 125, Sep. 25, 2006, pp. 240-241.

\* cited by examiner

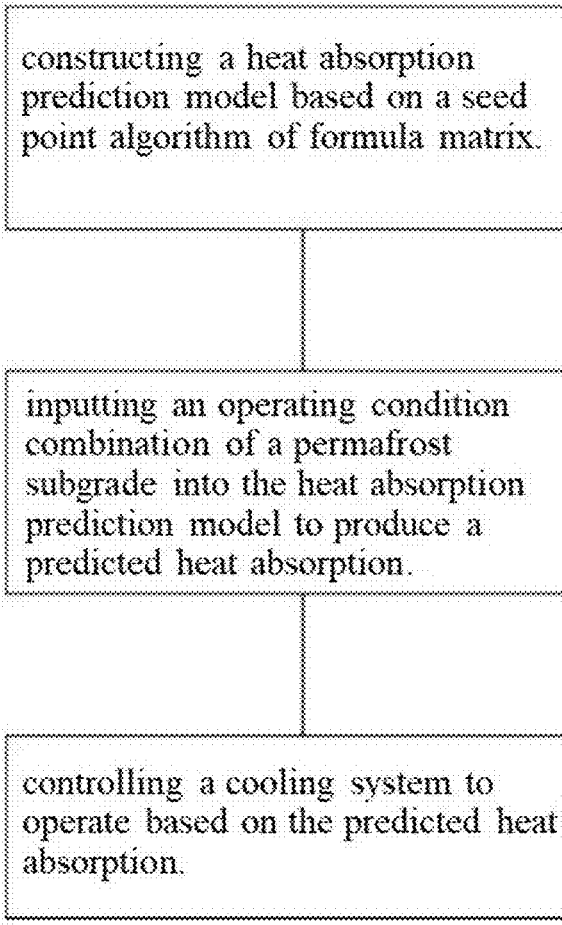

METHOD AND SYSTEM FOR CONTROLLING VENTILATION COOLING TYPE PERMAFROST SUBGRADE BASED ON ENERGY DYNAMIC BALANCE

CROSS-REFERENCE TO RELATED APPLICATIONS

This non-provisional application claims priority under 35 U.S.C. § 119(a) to patent application 202410088616.2 filed in P.R. China on Jan. 22, 2024, the entire contents of which are hereby incorporated by reference.

Some references, if any, which may include patents, patent applications and various publications, may be cited and discussed in the description of this application. The citation and/or discussion of such references, if any, is provided merely to clarify the description of this application and is not an admission that any such reference is "prior art" to the application described herein. All references listed, cited and/or discussed in this specification are incorporated herein by reference in their entirety and to the same extent as if each reference was individually incorporated by reference.

FIELD OF THE INVENTION

The present invention belongs to the field of subgrade engineering in permafrost areas, and particularly relates to a method and system for controlling ventilation cooling type permafrost subgrade based on energy dynamic balance.

BACKGROUND OF THE INVENTION

Permafrost refers to rock and soil that has been frozen under natural conditions for more than two years. Permafrost covers about 26% of the Earth's land area and is mainly distributed in cold areas at high latitudes or high altitudes. In China, there are about 2.15 million square kilometers of permafrost, mainly in the Qinghai-Tibetan Plateau, the Greater Hinggan and Lesser Hinggan areas, as well as mountainous areas such as the Altai, Tianshan and Qilian mountains.

Since the total solar radiation and the radiation balance value of the Qinghai-Tibetan Plateau are relatively large, the construction of black asphalt pavement in permafrost areas will increase the absorption rate of solar radiation in the permafrost subgrade by about 20%; in addition, asphalt pavement interferes with the evaporation process on subgrade surfaces, which will affect heat exchange between the permafrost and the atmosphere. Observational data show that the average annual surface temperature of asphalt pavement is higher than that of the natural surface by more than 4° C., thaws 20-30 days earlier, and freezes about 20 days later than the soil layer beneath the natural ground. Under this thermal influence, the total annual heat input of the soil layer under asphalt pavement is greater than the total annual output, resulting in permafrost thawing, lowering of the permafrost upper limit, and frequent occurrence of damage due to thermal thawing and settlement of the road subgrade, which seriously affects the operation and maintenance of highway projects in permafrost areas.

To solve the problems of subgrade thawing and settlement, the engineering measures adopted at present mainly include rubble subgrade, insulated plate subgrade, ventilation duct, thermosyphon, and so on. All the above measures are based on the combined principle of conduction (heat) and resistance (heat), which not only prevents heat from entering the permafrost but also dredges the heat within the permafrost. Among them, ventilated subgrade such as ventilation duct and ventilation plate, etc., as a cooling measure in the category of convective heat transfer, has been widely used in the field of road engineering in recent years. However, the current types of ventilated subgrade with special structures usually belong to natural ventilation and cold conduction, i.e., they can achieve the purpose of subgrade cooling only by natural ventilation and convection in the cold season. This kind of natural cold conduction has problems such as low cooling efficiency in warm seasons, uneven cooling throughout the year, and difficulty in preventing damage caused by subgrade thawing and settlement in warm seasons. In addition, it is difficult to take timely action to prevent serious subgrade damage during extreme climatic events, such as extremely high temperatures. It is also not flexible enough to cope with the frequent occurrence of extreme climatic conditions and sudden changes in the environment.

SUMMARY OF THE INVENTION

The present invention aims to overcome that permafrost subgrade cooling systems in the prior art are unable to cool flexibly according to real-time conditions, and proposes a method and system for controlling ventilation cooling type permafrost subgrade based on energy dynamic balance, which is capable of controlling a cooling system to operate in real-time by predicted heat absorption.

In order to achieve the above purpose, one aspect of the present invention provides a method for controlling ventilation cooling type permafrost subgrade based on energy dynamic balance, comprising the steps of
  constructing a heat absorption predicting model; and
  inputting an operating condition combination of a permafrost subgrade into the heat absorption predicting model to produce a predicted heat absorption for the permafrost subgrade, and controlling a cooling system to operate based on the predicted heat absorption;
  wherein the heat absorption predicting model is constructed based on a seed point algorithm of formula matrix, which comprises the steps of
  fitting a curve of heat absorption over time under a known operating condition combination of the permafrost subgrade to produce a known fitting formula;
  establishing a formula matrix by taking the known operating condition combination as coordinates of known seed points and the known fitting formula as an index formula of the known seed points; and
  constructing a new seed point from a newly inputted operating condition combination of the permafrost subgrade, selecting a plurality of known seed points closest to the new seed point from the formula matrix to calculate similarity weights between the plurality of known seed points and the new seed point, calculating a predictive fitting formula corresponding to the new seed point based on the similarity weights and the known fitting formula, and calculating the predicted heat absorption based on the predictive fitting formula.

In a preferred embodiment of the invention, the operating condition combination includes subgrade width, subgrade height, and permafrost ground temperature.

In a preferred embodiment of the invention, selecting the plurality of known seed points comprises the step of calculating coordinate distances between the new seed point and the known seed points in the formula matrix, wherein a plurality of known seed points with the minimum coordinate distances is the plurality of known seed points.

In a preferred embodiment of the invention, after selecting the plurality of known seed points, calculating the predictive fitting formula specifically comprises the steps of
- calculating weights for the plurality of known seed points based on the coordinate distances;
- performing a weighted averaging on heat absorption corresponding to the plurality of known seed points at each moment based on the weights, so as to produce a calculation result which is the heat absorption corresponding to the new seed point at a given moment; and
- fitting a curve of heat absorption over time for the new seed point based on the heat absorption corresponding to the new seed point at each moment, so as to produce the fitting formula of the new seed point.

In a preferred embodiment of the invention, during a warm season, the cooling system is controlled to operate by monitoring in real-time an actual heat absorption of the permafrost subgrade at a regular time interval, which specifically comprises the steps of
- monitoring in real-time an actual heat absorption of the permafrost subgrade, and fitting a curve of actual heat absorption over time based on the actual heat absorption over a period from the beginning of the warm season to the current moment;
- correcting the predictive fitting formula based on the curve of actual heat absorption over time to produce a corrected fitting formula; and
- determining the operation status of the cooling system during the warm season based on the corrected fitting formula and the actual heat absorption at the current moment, and if the cooling system is determined to be operating, determining the working power of the cooling system based on a required cooling capacity in real-time.

In a preferred embodiment of the invention, producing the corrected fitting formula specifically comprises the steps of
- substituting the curve of actual heat absorption over time at a corresponding position in a function curve corresponding to the predictive fitting formula to generate a new function curve; and
- performing a formula fitting again on the newly generated function curve to produce the corrected fitting formula.

In a preferred embodiment of the invention, determination formulas for determining the operation status of the cooling system during a warm season are as follows:
- if $Q3+Q4 \leq (Q1+Q2)*k$, the cooling system does not work, and
- if $Q4+Q5 > (Q1+Q2)*k$, the cooling system works;
- where k is a safety factor, $Q1$ is a cumulative heat absorption of the previous year, $Q2$ is the predicted heat absorption, $Q3$ is the actual heat absorption at the current moment, and $Q4$ is the remaining heat absorption in the warm season at the current moment, and $Q4$ is a heat absorption calculated by the corrected fitting formula during a period from the current moment to the end of the warm season.

In a preferred embodiment of the invention, operating the cooling system during a cold season comprises the steps of
- at the beginning of a cold season, predicting an annual heat absorption $Q5$ for the following year based on the corrected fitting formula and determining the operation status of the cooling system during the cold season; and
- if the cooling system works, calculating the working power of the cooling system in the cold season based on a required cooling capacity in the cold season;

wherein determination formulas are as follows:
- if $Qn \leq Q5*k$, the cooling system works, and
- if $Qn > Q5*k$, the cooling system does not work;
- where $Qn$ is a cooling capacity of natural ventilation during a cold season, a cooling capacity in the cold season is $k*[Q5*k-Qn]$, and then the working power of the cooling system in the cold season is calculated based on the duration of the cold season.

In a preferred embodiment of the invention, when the cooling system performs cooling during a cold season in the first year, a determination of a reserved cooling capacity for the next year is performed, and determination formulas are as follows:
- if $Qn \leq (Q6+Q7)*k$, the cooling system works, and
- if $Qn > (Q6+Q7)*k$, the cooling system does not work;
- where $Q6$ is a cumulative heat absorption in the first year and $Q7$ is a predicted cumulative heat absorption in the second year.

Based on the same idea, another aspect of the present invention provides a system for controlling ventilation cooling type permafrost subgrade based on energy dynamic balance, which comprises a heat absorption prediction module and a cooling system control module;
- wherein the heat absorption prediction module is used to construct a heat absorption predicting model to produce a predicted heat absorption for a permafrost subgrade; and
- the cooling system control module controls the cooling system to operate based on the predicted heat absorption.

BRIEF DESCRIPTION OF THE DRAWINGS

The following drawings are provided for illustrative purposes only and merely depict exemplary embodiments of the disclosure. These drawings are provided to facilitate the reader's understanding of the disclosure and should not be considered as limiting to the breadth, scope, or applicability of the disclosure. It should be noted that these drawings are not necessarily drawn to scale for clarity and ease of illustration.

The FIGURE illustrates a flowchart of a method for controlling ventilation cooling type permafrost subgrade based on energy dynamic balance according to the present invention.

DETAILED DESCRIPTION OF THE EXEMPLARY EMBODIMENT

The invention will be described in more detail below with reference to specific embodiments. However, the embodiments described below are merely illustrative and should not be construed as limiting the scope of the foregoing subject matter of the invention, and all technologies implemented according to the contents of the invention fall within the scope of the invention.

As shown in the FIGURE, a method for controlling ventilation cooling type permafrost subgrade based on energy dynamic balance according to the invention comprises the steps of
- constructing a heat absorption predicting model; and
- inputting an operating condition combination of a permafrost subgrade into the heat absorption predicting model to produce a predicted heat absorption for the permafrost subgrade, and controlling a cooling system to operate based on the predicted heat absorption;

wherein the heat absorption predicting model is constructed based on a seed point algorithm of formula matrix, which comprises the steps of fitting a curve of heat absorption over time under a known operating condition combination of the permafrost subgrade to produce a known fitting formula;

establishing a formula matrix by taking the known operating condition combination as coordinates of known seed points and the known fitting formula as an index formula of the known seed points; and constructing a new seed point from a newly inputted operating condition combination of the permafrost subgrade, selecting a plurality of known seed points closest to the new seed point from the formula matrix to calculate similarity weights between the plurality of known seed points and the new seed point, calculating a predictive fitting formula corresponding to the new seed point based on the similarity weights and the known fitting formula, and calculating the predicted heat absorption based on the predictive fitting formula.

In a preferred embodiment of the invention, the operating condition combination includes subgrade width, subgrade height, and permafrost ground temperature.

In a preferred embodiment of the invention, selecting the plurality of known seed points comprises the step of calculating coordinate distances between the new seed point and the known seed points in the formula matrix, wherein a plurality of known seed points with the minimum coordinate distances is the plurality of known seed points.

In a preferred embodiment of the invention, after selecting the plurality of known seed points, calculating the predictive fitting formula specifically comprises the steps of calculating weights for the plurality of known seed points based on the coordinate distances;

performing weighted averaging on the heat absorption corresponding to the plurality of known seed points at each moment based on the weights, so as to produce a calculation result which is the heat absorption corresponding to the new seed point at a given moment; and fitting a curve of heat absorption over time for the new seed point based on the heat absorption corresponding to the new seed point at each moment, so as to produce the fitting formula of the new seed point.

In a preferred embodiment of the invention, during a warm season, the cooling system is controlled to operate by monitoring in real-time an actual heat absorption of the permafrost subgrade at a regular time interval, which specifically comprises the steps of monitoring in real-time an actual heat absorption of the permafrost subgrade, and fitting a curve of actual heat absorption over time based on the actual heat absorption over a period from the beginning of the warm season to the current moment;

correcting the predictive fitting formula based on the curve of actual heat absorption over time to produce a corrected fitting formula; and determining the operation status of the cooling system during the warm season based on the corrected fitting formula and the actual heat absorption at the current moment, and if the cooling system is determined to be operating, determining the working power of the cooling system based on a required cooling capacity in real-time.

In a preferred embodiment of the invention, producing the corrected fitting formula specifically comprises the steps of substituting the curve of actual heat absorption over time at a corresponding position in a function curve corresponding to the predictive fitting formula to generate a new function curve; and performing a formula fitting again on the newly generated function curve to produce the corrected fitting formula.

In a preferred embodiment of the invention, determination formulas for determining the operation status of the cooling system during a warm season are as follows:

if $Q3+Q4 \leq (Q1+Q2)*k$, the cooling system does not work, and if $Q4+Q5>(Q1+Q2)*k$, the cooling system works;

where $k$ is a safety factor, $Q1$ is a cumulative heat absorption of the previous year, $Q2$ is the predicted heat absorption, $Q3$ is the actual heat absorption at the current moment, and $Q4$ is the remaining heat absorption in the warm season at the current moment, and $Q4$ is a heat absorption calculated by the corrected fitting formula during a period from the current moment to the end of the warm season.

In a preferred embodiment of the invention, operating the cooling system during a cold season comprises the steps of at the beginning of a cold season, predicting an annual heat absorption $Q5$ for the following year based on the corrected fitting formula, determining the operation status of the cooling system during the cold season; and if the cooling system works, calculating the working power of the cooling system in the cold season based on a required cooling capacity in the cold season;

wherein determination formulas are as follows:

if $Qn \leq Q5*k$, the cooling system works, and if $Qn>Q5*k$, the cooling system does not work;

where $Qn$ is a cooling capacity of natural ventilation during a cold season, a cooling capacity in the cold season is $k*[Q5*k-Qn]$, and then the working power of the cooling system in the cold season is calculated based on the duration of the cold season.

In a preferred embodiment of the invention, when the cooling system performs cooling during a cold season in the first year, a determination of a reserved cooling capacity for the next year is performed, and determination formulas are as follows:

if $Qn \leq (Q6+Q7)*k$, the cooling system works, and if $Qn>(Q6+Q7)*k$, the cooling system does not work;

where $Q6$ is a cumulative heat absorption in the first year and $Q7$ is a predicted cumulative heat absorption in the second year.

Based on the same idea, the present invention also provides a system for controlling ventilation cooling type permafrost subgrade based on energy dynamic balance, which comprises a heat absorption prediction module and a cooling system control module;

wherein the heat absorption prediction module is used to construct a heat absorption predicting model to produce a predicted heat absorption for a permafrost subgrade; and the cooling system control module controls the cooling system to operate based on the predicted heat absorption.

According to the method for controlling ventilation cooling type permafrost subgrade based on energy dynamic balance of the invention, it is possible to perform a cold reserve for the second year in a cold season by the decision given by a prediction model and to achieve predictive cooling. Furthermore, it is possible to modify the strategy of the control system in response to sudden changes in climate and environment and to respond in a flexible and timely manner. As a result, uneven cooling of the permafrost subgrade within a year can be prevented and the stability of service condition of the permafrost subgrade can be ensured.

In the present invention, the method for controlling ventilation cooling type permafrost subgrade based on energy dynamic balance can be implemented with the following construction steps S1-S8.

In step S1, at a subgrade construction stage during a new roadway construction process in permafrost areas, a real-time monitoring system for permafrost subgrade including, but is not limited to, a permafrost ground temperature monitoring system, a heat flow monitoring system, etc., is synchronously installed to provide real-time information on thermal state information of a permafrost subgrade.

In step S2, the monitoring system produces a heat absorption Q1 accumulated during the first year of subgrade construction.

In step S3, a local operating condition combination is input into a computer prediction model to predict an annual cumulative heat absorption Q2 for the second year by a computer prediction modeling algorithm as well as based on a local engineering condition. This process specifically comprises step S31 of constructing the computer prediction modeling algorithm, which can be implemented by further dividing step 31 into the following steps S311-S313.

In step S311, based on the team's preliminary on-site monitoring data and combined with a numerical calculation model, a heat absorption of permafrost subgrade under three operating condition combinations with different subgrade widths (10 m, 26 m), subgrade heights (1 m, 2 m, 3 m, 4 m) and permafrost ground temperatures (−0.5° C., −1° C., −1.5° C., −2° C., −3° C.) is produced, and then data results on heat absorption over time within a year are produced.

In step S312, a curve diagram of heat absorption versus time is plotted and the curve is fitted to produce a formula shaped like a sine function.

In step S313, a computer prediction modeling system is constructed by using a seed point algorithm based on a formula matrix.

More specifically, the computer prediction model of the invention is constructed by the following steps:

1) creating formula matrix (formulas): this matrix contains the amplitude, frequency, and phase of a known function formula, and each row corresponds to a known operating condition that includes three parameters of the function with respect to heat absorption over time;
2) defining seed points and new operating conditions: the seed points (points) matrix contains coordinate points of known operating conditions, where each row represents an operating condition that includes three environmental parameters required by the function of heat absorption over time, respectively; a new seed point (new_point) represents a new operating condition that also includes three environmental parameters;
3) calculating distances between a new seed point and known seed points: the Euclidean distance is calculated using the formula distance=sqrt((x1−x2)^2+(y1−y2)^2+(z1−z2)^2), where (x1, y1, z1) are the coordinates of the known seed points and (x2, y2, z2) are the coordinates of the new seed point; distance vectors (distances) are produced by calculating distances between the new seed point and all known operating conditions;
4) finding three known operating conditions with nearest distances: the distance vectors (distances) are sorted to produce sorted distance vectors (sorted_distances) and corresponding index vectors (sorted_indices); the first three index values are taken from the corresponding index vectors (sorted_indices) to produce indices for three known operating conditions with nearest distances (nearest_indices);
5) specifying period range: the range of time is specified, here a period is a full year, first the number of days in a full year is defined and converted to seconds, and then a linspace function is used to generate an array of time values containing 1,000 points to approximate the time of a full year; here the number of points in the array of time values can be adjusted according to the actual requirements;
6) calculating predicted heat absorption within a full year (y_values): to predict heat absorption over time for a new seed point, a cycle is used to process three known seed points with nearest distances; for each known seed point, its amplitude, frequency, and phase parameters are extracted, and then predicted values of heat absorption over time for the point within a full year are calculated; these predicted values are represented by a sine function and stored in a y_values array, which is used to represent the change in heat absorption within a full year.
7) calculating weights: the weights of three known operating conditions with nearest distances are calculated based on a reciprocal of the distance and normalized to ensure that their sum is equal to 1, and these weights are stored in weight vectors (weights);
8) performing distance-weighted averaging on predicted heat absorption within a full year (y_values): predicted y values within a period are multiplied by distance-weighted vectors (weights) to perform distance-weighted averaging, so as to produce a predicted y value (predicted_y);
9) fitting predicted heat absorption (y_values) with fitting curve: the predicted values of heat absorption after distance-weighted averaging are fitted as a function using a fitting curve (fit); this step aims to find a function that best fits the data after weighted averaging;
10) extracting fitted parameter values: the amplitude, frequency, and phase parameters are extracted from the fitting results and stored in newAmplitude, newFrequency, and newPhase, respectively;
11) outputting new formula corresponding to the operating condition: a new sine function formula is constructed and parameter values are embedded in the function handle; finally, a new function formula string is output to the console to display a periodic sine function corresponding to the new seed point; based on the output prediction results, the function is subjected to an integration operation to produce a predicted cumulative heat absorption under any time length within a year;

Once step S3 is completed, in step S4, the computer prediction system is used to predict a reserve cooling capacity (Q1+Q2)*k required for the second year, where k is a safety factor taken to be 1.2 according to relevant industrial specifications.

Then, in step S5, the operation status of the cooling system during a cold season of the first year is determined based on the reserve cooling capacity, wherein determination formulas are as follows:

when the cooling capacity of natural ventilation during a cold season Q3≤(Q1+Q2)*k, the active cooling system works;

when the cooling capacity of natural ventilation during a cold season Q3>(Q1+Q2)*k, the active cooling system does not work;

wherein the required cooling capacity is $k*[(Q1+Q2)*k-Q3]$, and the working power of the cooling system is determined based on the required cooling capacity and the length of the cold season in the first year so as to reserve a cooling capacity for the second year and to achieve predictive cooling, while cooling in the cold season can reduce energy consumption and improve the cooling efficiency.

Upon entering the second year, in step S6, determining the operation status of the cooling system for a warm season of the second year is performed, which specifically comprises the following steps S61-S64.

In step S61, a monitoring system is used to monitor the heat flow density of the subgrade in real time, and a real-time cumulative heat absorption Q4 is integrally calculated.

In step S62, based on the results of the monitoring and calculation, the formula of heat absorption over time in the second year is corrected in real-time, and this step is implemented by dividing into the following steps S621-6222.

In step S621, a function formula of heat absorption over time in the second year is produced by the prediction model, for example, the functional image curve is a curve of heat absorption y over time x, wherein, based on the real-time monitoring data of the monitoring system, a curve of measured heat absorption y* over time x* can be produced.

In step S622, a curve of measured values is substituted at a corresponding position in the prediction function curve, and the newly formed function curve is re-fitted into a formula to produce a new sine function formula; this correction is performed as follows:

1) defining parameters for the function formula of heat absorption over time: parameters A, b, and c represent the amplitude, frequency and phase difference of the sinusoidal function;
2) defining measured data for the curve of heat absorption over time: these data include the time point (xMeasured) and the heat absorption value (yMeasured);
3) constructing predicted function formula (predictedFormula): this function formula is represented by an anonymous function, where parameters in the function are the parameters of the function formula and the time variable x;
4) defining the type of fitting model (model): the independent variable is specified as x and the coefficients as A, b, and c, which correspond to parameters in the predicted function formula;
5) performing curve fitting: the predicted function formula (model) is fitted using measured data (xMeasured and yMeasured), and the fitting is performed by specifying a starting point (StartPoint) as a preset parameter value;
6) extracting parameter values after fitting (newA, newb, newc): these parameters are the optimal values after fitting;
7) defining new sine function formula (newFormula): this function formula is represented by an anonymous function, where parameters in the function is the time variable x, and parameter values derived from the fitting are used to construct a new function formula;
8) converting newFormula to function formula string (newFormulaString): the converting is performed using a func2str function;
9) producing function formula string: parameter names in the function formula string are substituted with specific parameter values using a string substitution method, so as to produce a function formula string that contains the specific parameter values;
10) displaying new function formula string: the output result is a function formula with specific parameter values;
11) calculating or plotting: newFormula is used to perform calculations or plotting operations.

Once step S62 is completed, in step S63, a cumulative heat absorption Q5 for the remaining time in the warm season of the second year is calculated based on formula correction results, where Q5 is an integral result of the newly corrected sine function formula for the remaining time in the warm season.

Then, in step S64, a real-time dynamic determination is performed, and the corresponding working power of the cooling system is also a real-time dynamic change. Since the actual working power of the cooling system is not easy to change instantaneously, it is determined once every 6 hours, and the cooling power is changed once. Specifically, determination formulas are as follows:

$Q4+Q5 \leq (Q1+Q2)*k$, the cooling system does not work; and $Q4+Q5 > (Q1+Q2)*k$, the cooling system works;

wherein a required cooling capacity in real-time is $k*[Q4+Q5-(Q1+Q2)*k]$, and the working power of the cooling system is determined based on the required cooling capacity in real-time and the remaining time in the warm season of the second year.

In the present invention, by monitoring the actual heat absorption in real-time, the formula of heat changes over time predicted in the present year is corrected, and then the operation status of the cooling system is determined based on a corrected formula so that uneven cooling of the permafrost subgrade within a year can be prevented and the service state of the permafrost subgrade is ensured to be stable. In addition, in response to sudden changes in climate and environment, the strategy of the control system can be modified in time for a more flexible and timely response.

In step S7, the process of step S2-S6 is repeated following the end of a warm season in the second year. Since the real-time monitoring and correction have been started in the warm season of the second year, the operation status of the cooling system in a cold season from the second year is determined based on corrected prediction formulas, which specifically comprise:

if $Qn \leq Q6*k$, the cooling system works; and
if $Qn > Q6*k$, the cooling system does not work;
where Qn is a cooling capacity of natural ventilation during a cold season, and Q6 is a predicted value of heat absorption in the next year derived from corrected prediction formulas when the warm season is finished.

In the present invention, the cooling capacity during a cold season is $k*[Q5*k-Qn]$, and the working power of the cooling system during a cold season is calculated based on the duration of the cold season. Starting from the second year, the heat absorption for the next year is calculated using the corrected prediction formula at the end of the current warm season, which is more accurate in prediction and better adapted to the actual changes in a local permafrost subgrade. In addition, the operation status of the cooling system during a cold season is further determined based on the predicted heat absorption in the next year, which can better ensure the cooling effect while reducing the cooling energy consumption.

In step S8, upon entering the third year, each of the third and subsequent years refers to the workflow of the cooling system in the second year. As a result, since continuous corrections are made based on actual on-site conditions which are monitored in real-time, the method of the invention can be applied stably to the work of controlling the cooling system in the permafrost subgrade for a long time.

In summary, according to the method and system for controlling ventilation cooling type permafrost subgrade based on energy dynamic balance of the present invention, a heat absorption predicting model is constructed based on a seed point algorithm of formula matrix, and different combinations of permafrost subgrade operating condition are inputted into the heat absorption predicting model to predict heat absorption, and then a cooling system is controlled to operate by predicted heat absorption. As a result, an economical and reasonable control strategy is given to fully utilize the natural cooling energy and reduce energy consumption.

All the above are only some of the preferred embodiments of the invention and are not intended to limit the invention. The invention may also have a variety of other embodiments, and without departing from the spirit and substance of the invention, a person skilled in the art may make various changes and modifications in accordance with the invention, but such changes and modifications shall fall within the protection scope of the invention.

What is claimed is:

1. A method for controlling ventilation cooling type permafrost subgrade based on energy dynamic balance, comprising the steps of
   constructing a heat absorption predicting model; and
   inputting an operating condition combination of a permafrost subgrade into the heat absorption predicting model to produce a predicted heat absorption for the permafrost subgrade, and controlling a cooling system to operate based on the predicted heat absorption;
   wherein the heat absorption predicting model is constructed based on a seed point algorithm of formula matrix, which comprises the steps of
   fitting a curve of heat absorption over time under a known operating condition combination of the permafrost subgrade to produce a known fitting formula;
   establishing a formula matrix by taking the known operating condition combination as coordinates of known seed points and the known fitting formula as an index formula of the known seed points; and
   constructing a new seed point from a newly inputted operating condition combination of the permafrost subgrade, selecting a plurality of known seed points closest to the new seed point from the formula matrix to calculate similarity weights between the plurality of known seed points and the new seed point, calculating a predictive fitting formula corresponding to the new seed point based on the similarity weights and the known fitting formula, and calculating the predicted heat absorption based on the predictive fitting formula, wherein during a warm season, the cooling system is controlled to operate by monitoring in real-time an actual heat absorption of the permafrost subgrade at a regular time interval, which specifically comprises the steps of
   monitoring in real-time an actual heat absorption of the permafrost subgrade, and fitting a curve of actual heat absorption over time based on the actual heat absorption over a period from beginning of the warm season to current moment;
   correcting the predictive fitting formula based on the curve of actual heat absorption over time to produce a corrected fitting formula; and
   determining the cooling system whether or not to work during the warm season based on the corrected fitting formula and the actual heat absorption at the current moment, and
   determining a working power of the cooling system based on a required cooling capacity in real-time when the cooling system is determined to work.

2. The method for controlling ventilation cooling type permafrost subgrade based on energy dynamic balance according to claim 1, wherein the operating condition combination includes subgrade width, subgrade height, and permafrost ground temperature.

3. The method for controlling ventilation cooling type permafrost subgrade based on energy dynamic balance according to claim 1, wherein selecting the plurality of known seed points comprises the step of calculating coordinate distances between the new seed point and the known seed points in the formula matrix, wherein a plurality of known seed points with the minimum coordinate distances is the plurality of known seed points.

4. The method for controlling ventilation cooling type permafrost subgrade based on energy dynamic balance according to claim 3, wherein after selecting the plurality of known seed points, calculating the predictive fitting formula specifically comprises the steps of
   calculating weights for the plurality of known seed points based on the coordinate distances;
   performing weighted averaging on the heat absorption corresponding to the plurality of known seed points at each moment based on the weights, so as to produce a calculation result which is the heat absorption corresponding to the new seed point at a given moment; and
   fitting a curve of heat absorption over time for the new seed point based on the heat absorption corresponding to the new seed point at each moment, so as to produce the fitting formula of the new seed point.

5. The method for controlling ventilation cooling type permafrost subgrade based on energy dynamic balance according to claim 1, wherein producing the corrected fitting formula specifically comprises the steps of
   substituting the curve of actual heat absorption over time at a corresponding position in a function curve corresponding to the predictive fitting formula to generate a new function curve; and
   performing a formula fitting again on the new function curve to produce the corrected fitting formula.

6. The method for controlling ventilation cooling type permafrost subgrade based on energy dynamic balance according to claim 5, wherein determination formulas for determining the cooling system whether or not to work during the warm season are as follows:
   if $Q3+Q4 \leq (Q1+Q2)*k$, the cooling system does not work, and
   if $Q4+Q5 > (Q1+Q2)*k$, the cooling system works;
   where k is a safety factor, Q1 is a cumulative heat absorption of previous year, Q2 is the predicted heat absorption, Q3 is the actual heat absorption at the current moment, Q4 is the remaining heat absorption in the warm season at the current moment, and Q4 is a heat absorption calculated by the corrected fitting formula during a period from the current moment to end of the warm season.

7. The method for controlling ventilation cooling type permafrost subgrade based on energy dynamic balance according to claim 6, wherein operating the cooling system during a cold season comprises the steps of at beginning of a cold season, predicting an annual heat absorption Q5 for the following year based on the corrected fitting formula and determining the operation status of the cooling system during the cold season; and if the cooling system works, calculating the working power of the cooling system in the cold season based on a required cooling capacity in the cold season;

wherein determination formulas are as follows:

if $Qn \leq Q5*k$, the cooling system works, and if $Qn > Q5*k$, the cooling system does not work;

where Qn is a cooling capacity of natural ventilation during a cold season, a cooling capacity in the cold season is $k*[Q5*k-Qn]$, and then the working power of the cooling system in the cold season is calculated based on a duration of the cold season.

8. The method for controlling ventilation cooling type permafrost subgrade based on energy dynamic balance according to claim 7, wherein when the cooling system performs cooling during a cold season in a first year, a determination of a reserved cooling capacity for a next year is performed, and determination formulas are as follows:

if $Qn \leq (Q6+Q7)*k$, the cooling system works, and if $Qn > (Q6+Q7)*k$, the cooling system does not work;

where Q6 is a cumulative heat absorption in the first year and Q7 is a predicted cumulative heat absorption in the second year.

\* \* \* \* \*